United States Patent [19]
Wada et al.

[11] Patent Number: 5,205,147
[45] Date of Patent: Apr. 27, 1993

[54] PRE-LOADED ACTUATOR USING PIEZOELECTRIC ELEMENT

[75] Inventors: Tatuya Wada; Hiroshi Hikita; Nobutaka Machida; Mituharu Nonami, all of Saitama; Yukinori Kawamura, Kanagawa; Norikatu Matumoto, Yokosuka; Yoshiyuki Ohmura, Saitama; Tetuo Nomoto, Tokyo, all of Japan

[73] Assignee: Fuji Electric Co., Ltd., Japan

[21] Appl. No.: 738,156

[22] Filed: Jul. 30, 1991

Related U.S. Application Data

[63] Continuation-in-part of Ser. No. 522,183, May 11, 1990, Pat. No. 5,095,725.

[30] Foreign Application Priority Data

| May 12, 1989 | [JP] | Japan | 1-117493 |
| May 12, 1989 | [JP] | Japan | 1-117494 |
| Sep. 4, 1989 | [JP] | Japan | 1-227451 |

[51] Int. Cl.⁵ .................................. B21J 7/20
[52] U.S. Cl. ............................. 72/429; 72/430; 72/446; 310/328
[58] Field of Search .......... 310/328; 72/32, 56, 72/430, 446, 452, 707, 429; 29/25.35

[56] References Cited

U.S. PATENT DOCUMENTS

| 4,438,364 | 3/1984 | Morison | 310/328 |
| 4,471,256 | 9/1984 | Igashira et al. | 310/328 |
| 4,781,477 | 11/1988 | Nagasawa | 310/328 |
| 4,909,440 | 3/1990 | Mitsuyasu et al. | 310/328 |
| 4,967,586 | 11/1990 | Hecht | 72/451 |
| 5,004,945 | 4/1991 | Tomita et al. | 310/328 |

FOREIGN PATENT DOCUMENTS 0100059 7/1980 Japan ............................. 310/328

Primary Examiner—David Jones
Attorney, Agent, or Firm—Brumbaugh, Graves, Donohue & Raymond

[57] ABSTRACT

Pre-loaded piezoelectric actuators provide improved work piece displacement, frequency of repetition, accuracy and repeatability. Actuators may use a coil spring providing a compressive force adequate to substantially fully compress a laminated piezoelectric element on a non-destructive basis. Upon activation, a pre-loaded actuator delivers a full workpiece drive stroke because piezoelectric element axial compression has previously occurred. Pre-loading methods and pre-loading to damp out element oscillation are also disclosed.

17 Claims, 9 Drawing Sheets

PRE-LOADED ACTUATOR USING PIEZOELECTRIC ELEMENT

This application, which is a continuation-in-part of application 07/522,183, filed May 11, 1990, now U.S. Pat. No. 5,095,725 particularly directed to piezoelectric actuators as generally illustrated in FIGS. 1, 2 and 3, which are pre-loaded so as to provide improved performance in areas such as the characteristics listed above. Pre-loading in accordance with the invention is more particularly described below under the heading "High Performance Piezoelectric Actuators."

BACKGROUND OF THE INVENTION

The present invention relates to a pre-loaded piezoelectric actuators using a piezoelectric element. Pre-loading, by use of a coil spring for example, applies compressive force to the piezoelectric element to enhance the length of drive stroke of a movable work piece, positioning accuracy piece and the operating frequency range.

In applications of piezoelectric actuators in piezo-press systems in which a piezoelectric element is used to drive a work delivering drive stroke displacement for punching or forming metal, for example, several actuator characteristics are important. In high-speed press applications, for example, a piezoelectric actuator may be used to provide output forces as large as several hundred kilograms to several tons and in processing a sheet of metallic foil of a thickness such as 10 $\mu$m, work piece positioning accuracy of 1 $\mu$m may be required. In such applications, important actuator characteristics include:

- effective high-force work piece drive;
- accuracy and repeatability of work piece positioning;
- length of work piece drive stroke;
- work piece drive repetition frequency;
- adjustability of work piece positioning;
- ease of actuator installation, etc.

This application, which is a continuation-in-part of application 07/522,183, filed May 11, 1990, now U.S. Pat. No. 5,095,725 is particularly directed to piezoelectric actuators as generally illustrated in FIGS. 1, 2 and 3, which are pre-loaded so as to provide improved performance in areas such as the characteristics listed above. Pre-loading in accordance with the invention is more particularly described below under the heading "High Performance Piezoelectric Actuators."

Conventional press machines or systems generally use a die closing, wedge-type or toggle-type mechanism for die opening and closing, with the die-closing mechanism being driven and operated by a hydraulic cylinder or an air cylinder.

Further, specialty-parts assembling machines and assembling jigs also generally use a hydraulic cylinder or an air cylinder as the actuator to attach parts brought into the jig, as in the above case.

The above-mentioned conventional presses that are generally used have, in addition to the complexity of their die-closing mechanism, the problem that when using electric signals to control the presses, it is difficult to synchronize the operation of the mechanism of the main body of the press to the die-closing mechanism because the die-closing mechanism is operated by a hydraulic cylinder or an air cylinder.

Generally, press systems or mechanisms using piezoelectric elements had the following problems:

1. Because the die was a fixed-stripper type, warping occurred while shearing the material to be processed. Further, an actuator using a piezoelectric element only operates compressively and breaks down in tension making it impossible to drive the die set.

2. Since the structure is such that an actuator using a layer-type piezoelectric element directly drives a punch, its dismantling and replacement when damaged or degraded consumed a great deal of time.

3. Since the actuator using a layer-type piezoelectric element was mounted directly on a die, the actuator had to be installed on another die to process parts of a different shape.

4. The actuators or dies using a piezoelectric element required a special device to mount and hold them.

5. Because the conventional actuator using a piezoelectric element was not installed as an independent device, a replacement of the actuator and the movable piece required a great amount of time.

6. Because the insulation between the case and the actuator used an air space, a hazardous electrical shock could have been caused by a short circuit to the case during operation.

7. It was impossible to measure length of stroke of the movable piece.

8. In assembling the layer-type piezoelectric element and the movable piece into the drive mechanism, a space was created between the movable piece and the movement-receiving end of the drive mechanism because of insufficient processing precision. As a result, the drive mechanism became incapable of performing the desired operation.

9. Because the case for the piezoelectric element was made of a material having a larger thermal expansion coefficient than that of the piezoelectric element, the case expanded slightly in size during operation and caused malfunctions.

10. The case for the piezoelectric element was deformed by a high-load output and became incapable of reproducing the stroke length setting at no load.

11. The movable piece in the actuator, which used ferrous material, was compressed by the high loading and resulted in a reduction of the length of the stroke.

12. Because some conventional configurations had the layer-type piezoelectric element arranged in series with the resilient element that applies a compressive force constantly to the piezoelectric element, the length of the piezoelectric actuator needed to be longer than that of the layer-type piezoelectric element, thus limiting the compactness of the piezoelectric actuator.

The present invention was made in light of the above problems Its first purpose is to provide an actuator using materials and parts that will allow simplified construction and that will make the actuator able to respond speedily to the operation and able to synchronize its motion directly from electric signals.

The second purpose of the present invention is to enhance processing precision and durability of a relatively low-cost press with replaceable parts that can be easily dismantled.

The third purpose of the present invention is to provide an actuator using a piezoelectric element which is easily handled and of high precision.

The fourth purpose of the present invention is to provide an actuator using a piezoelectric element which is compact, of high precision, and reliable.

SUMMARY OF THE INVENTION

Applications of actuators in accordance with the present invention include (See FIGS. 14 and 15) a press structured so that a piezoelectric element (82) is arranged slidably in a cylindrical case (81) with one end of this piezoelectric element (82) being directly coupled to the rear of a work piece, shown as punch (83), with the punch being driven by repetitive activation of the piezoelectric element (82). Element (82) is supplied with a repetitive pulse voltage from a power source (87), thereby punching out the material to be processed (86), which is retained by a die (85). A coil spring (84) is inserted between the cylindrical case (81) and a movable piece (or work piece means) (83) in series with the layer-type piezoelectric element (82). The coil spring (84) returns the displaced movable piece (83) (or work piece), as well as applies a constant, compressive stress to the layer-type piezoelectric element (82). The reason for applying the constant, compressive stress to the layer-type piezoelectric element (82) is that the layer-type piezoelectric element (82) is mechanically weak against a tensile stress, as it is made of layers comprising a great number of piezoelectric elements arranged in thin sheets. Therefore, the compressive force application is indispensable for this kind of actuator. In accordance with the invention, this compressive force is increased beyond levels previously used to hold the elements in place, so as to pre-load the piezoelectric element to provide the advantages discussed above.

The proposed device, which uses the piezoelectric element (82) as an actuator, can variably control operation strokes (displacements) of the punch (83) with a good response (on the order of μm). Element (82) is supplied with voltage from the power source (87) that can selectively control the application voltage and provide a high-speed beating pulsation onto the material to be processed (86). Thus breakage and burrs on cut faces is suppressed, and the material to be processed can be sheared and punched with a highly accurate and smooth-sheared face.

In accordance With the invention, a self-contained pre-loaded piezoelectric actuator unit, for repetitively displacing a work piece from a reference position, includes a piezoelectric element (including a plurality of laminations in an axial stack which is compressible by a predetermined axial amount by non-destructive compressive force) for displacing a work piece and a work piece positioned at a first end of the piezoelectric element. The actuator unit also includes support means, for supporting said piezoelectric element and said work piece, including an end member for restraining a second end of said piezoelectric element It further includes resilient means, resiliently coupling the work piece and the piezoelectric element to the end member, for pre-loading the piezoelectric element by applying sufficient force to compress the piezoelectric element by substantially the predetermined axial amount and attachment means for enabling attachment of the support means in an operating position. As described, the actuator unit may be attached in an operating position to externally apply the work piece displacement and the pre-loading enhances full displacement of the work piece.

Also in accordance with the invention, a method for pre-loading a piezoelectric actuator unit to enhance work piece displacement and cycling frequency range, includes the steps of:

(a) providing a form of piezoelectric actuator unit including a form of laminated piezoelectric element whose axial length may be shortened by application of compressive force, a work piece, a support device, and spring means for resiliently holding the work piece and piezoelectric element against an end member of the support device;

(b) determining the amount of compressive force necessary to produce substantially the maximum shortening of the axial length of the piezoelectric element when subjected to non-destructive compressive force;

(c) providing spring means able to exert a pre-loading force of substantially the amount of compressive force as determined in step (b); and (d) assembling the form of piezoelectric actuator unit as described in step (a) incorporating the spring means as provided in step (c) to provide a pre-loaded piezoelectric actuator unit which is substantially free of work piece displacement loss due to piezoelectric element compression under load.

An additional embodiment of the present invention has a position-adjusting mechanism constructed at the end of the case, which is capable of making variable adjustments (both coarse and fine) to the mounting position of the movable piece.

A further embodiment of the present invention has a feature wherein an elongation of the case caused by temperature variations in the operating environment is approximately equal to the elongation of the piezoelectric element, as a result of the case being made in part with a material having a lower thermal expansion rate than that of the piezoelectric element and in part with a material having a higher thermal expansion rate than that of the piezoelectric element.

Further embodiments of the present invention are characterized in that a part of the case may be made of a ceramic material having a higher longitudinal resilience, or "stiffer" elasticity, than ferrous metal and the movable piece may be made of a material having a higher longitudinal resilience rate, i.e. stiffer elasticity than a typical ferrous metal.

The construction; functions and applications of actuators in accordance with the invention are additionally described as follows:

1. The piezoelectric element used in the actuator comprises many layers of piezoelectric ceramic sheets made of material such as barium titanate porcelain. As is well known, when excited with an electric field, a piezoelectric element distorts itself in response to the direction of the electric field. Structuring the distorting direction as a result of the piezoelectric effect to match the laminating direction of the piezoelectric ceramic sheets will provide a relatively large elongation displacement for the piezoelectric element as a whole. Therefore, if the piezoelectric element is incorporated in a press die or an assembly jig as an actuator and is operated by electric signals to carry out die opening and closing of a press die and/or closing of an assembly jig, a material or part loaded on the press die or the assembly jig can be clamped in a predetermined position in the press die of the assembly jig. Its operation response time is much faster than if a hydraulic or air cylinder is used, and the operation can be timed directly by electric signals.

Therefore, because the actuator uses a piezoelectric element to perform an actuator operation using the displacement generated by the piezoelectric element for clamping a material or part in a predetermined position, a. the system simplifies the conventional structure of a mechanical actuator using a hydraulic or air cylinder, improves the response time and can use operating timing signals directly from electric signals; and b. when applied and implemented (particularly in a die-closing mechanism of a press), the system greatly simplifies the structure of the die-closing mechanism and facilitates the synchronizing of the operation of the die-closing mechanism with that of the press.

2. In a press which uses an actuator using a piezoelectric element for a punch drive source, a movable stopper made of a stiff material is disposed in a die (press die) to hold down a material to be processed in a shearing process, and a clamping actuator using a piezoelectric element is disposed in the die independently from the punch drive source to return the movable stopper to its initial position. In this configuration, the punch shears the material while the movable stopper holds it down, thus reducing deformation of the material, such as warping. Moreover, incorporating the actuator in the die makes the press device more compact, and allows the actuator as the punch drive source to perform all of the stroke operations of the punch, so that it is not necessary to drive the die set.

3. In a press device, which uses an actuator with a piezoelectric element as a punch drive source, when the actuator needs a replacement because of damage or deterioration, the structure allows the replacement of said actuator without having to dismantle the die section. This configuration facilitates dismantling of the punch for grinding, because the actuator has a piezoelectric element and the punch in contacted for transmission, and because the resilient element is used to press and hold the punch on the actuator in the die.

4. In a press device, which uses an actuator with a piezoelectric element as a punch drive source, the structure eliminates the need of removing the actuator at the press die interface, and facilitates shearing materials with different shapes, by disposing a frame to mount the actuator and incorporating the die in this frame. See FIG. 1 and 9.

5. In a press device, which uses an actuator with a piezoelectric element as a punch drive source, the structure eliminates the need for a special mounting location for the device, and allows fabrication of the device at a lower cost. This is done by disposing self-standing legs at the bottom of the frame or the die.

6. The displacement of a piezoelectric element is transmitted externally through a movable piece, rather than by coupling the piezoelectric element with an external device. A guide plate to guide this movable piece is removable on the mounting side of the case. Therefore, the actuator takes a single and independent form, and allows easy replacement without having to dismantle the mechanism with the piezoelectric element and the movable piece whenever the piezoelectric element is damaged or deteriorated or the movable piece is worn out and in need of replacement.

7. In addition, because an insulating element, also functioning as an axial stopper to stop the movable piece, is interposed between the piezoelectric element and the case, the actuator's position can be determined accurately and safely, and prevents a short circuit with the case during an insulation breakdown, eliminating the danger of electric shock to the operator.

8. Furthermore, a displacement transmitting part for measuring the stroke, which is on the movable piece and projecting externally from the opening on the case surface, measures the operation stroke directly and accurately on the actuator side.

9. A position-adjusting mechanism on the case end is capable of variably adjusting a mounting position of the movable piece, both in coarse and fine adjustments, allows an operator to accurately adjust the extension amount of the movable piece. This allows the desired depth of operation after the piezoelectric element is adjusted within the case.

10. The case is formed with two kinds of material, one having a lower thermal coefficient of expansion and the other having a higher thermal coefficient at expansion than that of the piezoelectric element in order to make the elongation of the piezoelectric element caused because of ambient temperature variations nearly equal to that of the case. Therefore, the structure eliminates variation in the extension amount of the movable piece from its initial setting caused by temperature variations, and drives the actuator from an initially set condition without adjustment, regardless of ambient temperature variation.

11. Furthermore, using in part of the case a ceramic material that can withstand the high load needed to cause a deformation of the piece being processed, enables, together with the function described in Item (10) above, the reduction of the elongation of the case caused from the load present during operation of the piezoelectric element, and prevents the stroke from becoming smaller, thus realizing a more compact actuator and eliminating the need for rust prevention treatment on the case surface.

12. Structuring the movable piece with highly longitudinally resilient material having a higher longitudinal resilience than steel, i.e. being "stiffer" than steel, such as cemented carbide or ceramic, reduces the compressive distortion of the movable piece caused from a load during operation of the piezoelectric element. This structure prevents the effective operating stroke from becoming smaller, making the actuator more compact, and eliminating the need for rust preventive treatment on slides, as well as reducing slide play.

13. Connecting the piezoelectric element in parallel with a resilient element to apply a compressive stress constantly to the piezoelectric element makes the total length of the piezoelectric actuator shorter than the conventional actuator typically connected in series, thus making it possible for the actuator to be more compact.

BRIEF DESCRIPTION OF DRAWINGS

FIGS. 10 (D), (E) and (F) are cross sectional drawings showing the flat punch-out process implemented in this embodiment of the present invention;

DETAILED DESCRIPTION OF THE PREFERRED EMBODIMENTS

Figure 1:
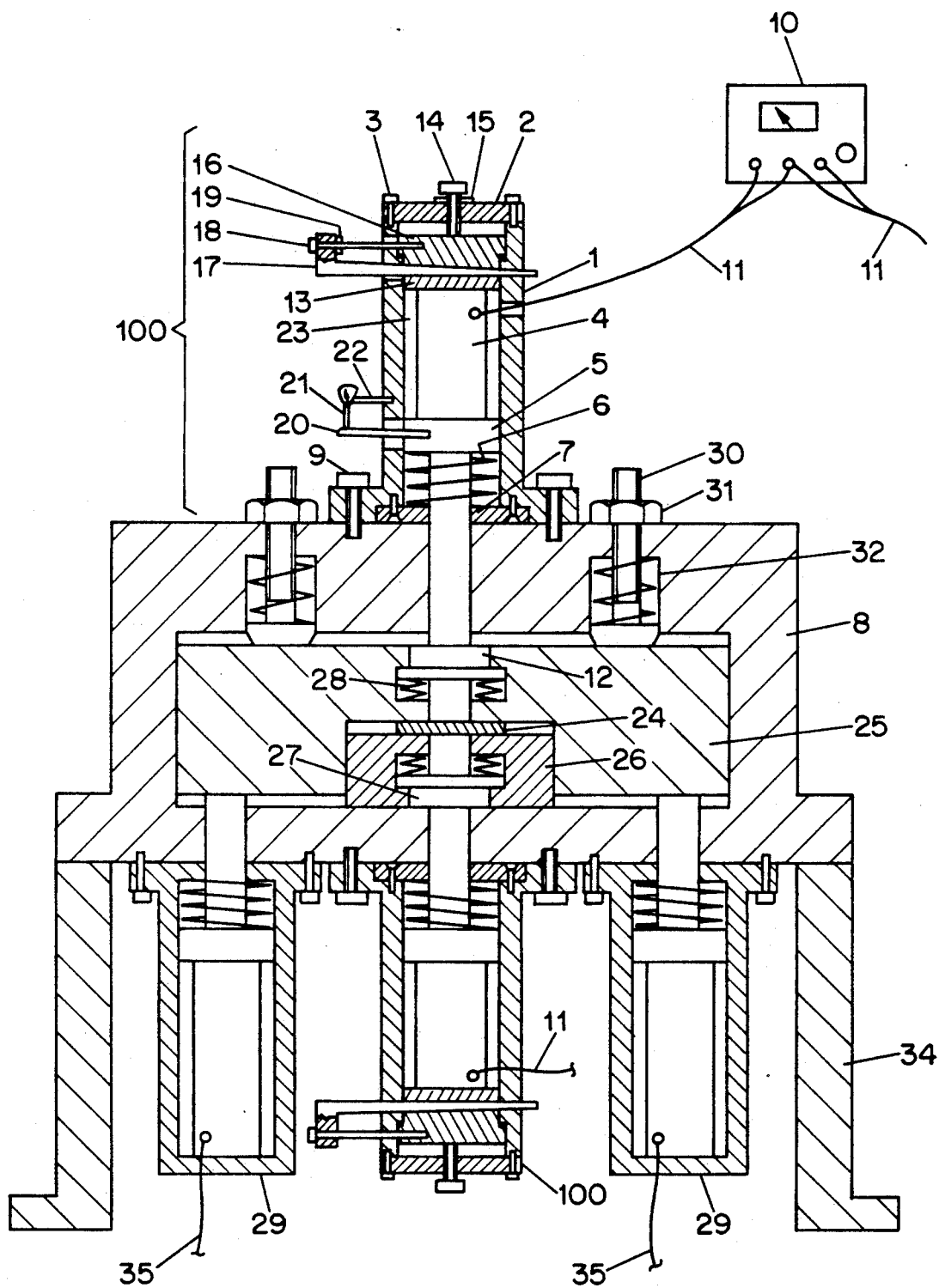
FIG. 1 is a longitudinal cross section showing the entire structure according to the first embodiment of the present invention.

Detailed explanations are hereunder given to the embodiments of the present invention, referring to the drawings.

A. First Embodiment

FIG. 1 shows the entire structure associated with the cylinder device 100, the first embodiment of the present invention, which has as an actuator made of a piezoelectric element and a press punching device which is disposed within this cylinder device.

First, an explanation is given of the cylinder device (100). Part 1 is a hollow cylindrical cylinder case, 2 is a lid fixed on one end of the cylinder case (1) by multiple screws (3), and 4 is an actuator using a piezoelectric element to generate the piezoelectric force. The actuator is structured by laminating many piezoelectric ceramic sheets made of materials such as barium titanate porcelain, and is contained in a case (I). As is well known, when an electric field is applied, a piezoelectric element distorts itself using its piezoelectric effect in response to the direction of the electric field. Structuring the distorting direction as a result of the piezoelectric effect to match the laminating direction of the piezoelectric ceramic sheets will provide a relatively large elongation displacement for the piezoelectric element as a whole in response to the application of an electric field.

Part (5) is a piston-shaped movable piece (or work piece) contained in the case (1), which slides and moves linearly to transmit externally the displacement of the actuator (4). Part (6) is a spring contained in the case (1), which forces the movable piece (5) in close contact with the actuator (4), and (7) is a guide plate to assist the linear motion of the movable piece (5), having a through hole to guide the shaft (rod) of the movable piece (5).

The movable piece (or work piece) (5), the spring (6) and a motion movable-piece, position-adjusting elements (described later) are housed in the case (1). The guide plate (7) is fitted into a recess at the end of the operating mechanism mounting side of the case (1), and fastened by multiple screws. Thus, a cylinder device (100) which is separate and completely independent from the rest of the machine to which the cylinder device is to be mounted (for example, a press) is obtained. Because the cylinder device (100) can be mounted on the operating mechanism with the actuator (4) contained in the case (1), it allows easy and quick replacement if the actuator (4) is damaged or the movable piece (5) is worn out. Part (9) are the multiple screws used to mount the cylinder device (100) to the rest of the operating mechanism (a frame (8) of the press punching device in this embodiment). A flange at the end of device 100 provides a mounting means for screws (9).

Part (10) is a power supply unit used to apply a pulse voltage to the actuator (4). When the power supply unit (10) applies a pulse voltage to the actuator (4) through a lead (11), the actuator (4) expands and contracts along an axial direction of the case (1) as a result of the piezoelectric effect generated in the piezoelectric element. When the actuator (4) expands, it pushes the movable piece (5), which in turn pushes down a mechanism motion receiving end (12) in the press punching device. When the actuator (4) contracts, the movable piece (5) returns because of the upward force of the spring (6).

Part (20) is a displacement indicating piece used to extract and measure the displacement of the linear movement of the movable piece (or work piece) (5). The rear end of the displacement indicating piece (20) passes via a through hole with a groove shaped opening in the cylindrical section of the case (1), and is mounted nearly horizontally on the head or shaft of the movable piece (5). Part (21) is a displacement measuring device to measure the moving position of the movable piece (5) using the displacement transmitting piece (20), and is mounted to a fixed arm (22) fastened on the outer wall of the case (1). The displacement measuring device (21) may be an ordinary mechanical or electric micrometer having a probe to contact with the tip of the displacement transmitting piece (20), or a non-contacting air micrometer or a laser measuring device. Because this structure allows a simple and direct measurement of an operation stroke of the movable piece (5) outside the case (1), an operator can check at any time if the cylinder device (11) is operating properly, and can precisely adjust the position of the movable piece (5) while observing its movement.

Figure 2:
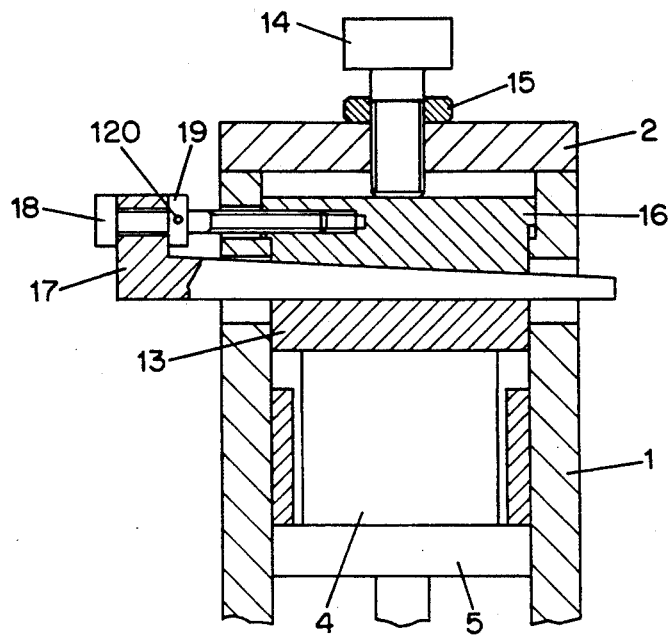
FIG. 2 is an expanded cross section showing in detail an adjusting mechanism for positioning a movable piece in the cylinder device shown in FIG. 1.

FIG. 2 is an expanded view of the adjusting mechanism for adjusting the initial position of the movable piece (5) in the cylinder device (100) shown in FIG. 1. In FIG. 2, Part (13) is a flat spacer plate housed in the case (1), and located on the head of the actuator (4), with the spacer (13) being made in various thicknesses. By varying the thickness of the spacer (13), an initial external extension of the movable piece (5) from the flange plane on the mounting side of the case (1) is adjusted Part (14) is an adjusting screw that fits a female screw passing through the center of the lid (2) fixed on the end of the case (1), and part (15) is a locking nut for locking the adjusting screw (14). Part (16) is a wedge having a tapered plane of a trapezoidal cross section, and part (17) is an L-shaped tapered wedge, which has a tapered plane (slope) with the same slant angle as that on the tapered plane of the wedge (16) thereby complementing wedge (16). Wedge (17) is longer than the diameter of the case (1). Part (18) is an adjusting screw passing through the head of the tapered wedge standing upright, and fixed through a ring (19) and a knock pin (20). The male screw on the tip of the adjusting screw (18) fits the female screw formed horizontally on the wedge (16), and adjusts the inserting position of the tapered wedge (17) as the screw is rotated with respect to wedge (16). Note that the surfaces of the wedges in contact with the coarse adjusting screw (14) and the piezoelectric element stag parallel to each other as the overall thickness of the combination of the two wedges is adjusted by the sideways adjustment of wedge (17).

In other words, when the adjusting screw (18) is rotated clockwise (forwardly), it moves the tapered wedge (17) towards the right-hand side of the drawing. When the adjusting screw (18) is rotated counterclockwise, the tapered wedge (17) moves to the left-hand side. Since the contact face of the wedge (16) and the tapered wedge (17) is slanted, the position of the tapered wedge (17) moves in an axial direction of the case (1) relative to the inserting position of the tapered wedge (17), and finely adjusts the initial extended amount of the movable piece (5) through the spacer (13) and the actuator (4) in the piezoelectric element.

To set the position of the actuator (4) and the movable piece (5), rotate the adjusting screw (14) for a coarse adjustment. Lock this position to the lid (2) by the lock nut (15). If further fine adjustment is required, screw the adjusting screw (18) into the wedge (16) to slide the tapered wedge (17), and set the position. Then insert the locking knock pin (20) into a hole on the ring (19), and the adjusting screw (18) is set. Thus, it is possible to adjust the mounting position of the movable piece (5) as desired using the coarse adjustment or the fine adjustment, or both. Therefore, the cylinder device (100) enhances its versatility, facilitates maintenance and provide high-precision processing.

Figure 3:
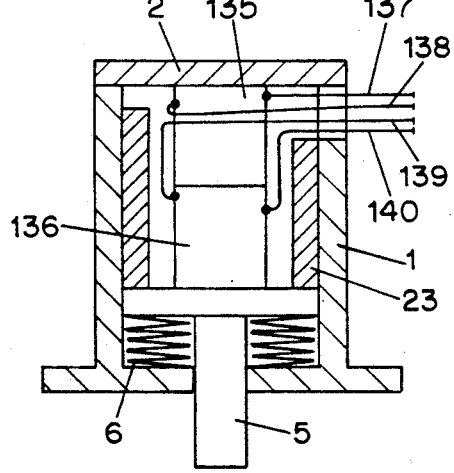
FIG. 3 is a summarized cross section showing how the insulating cylinder in a cylinder device shown in FIG. 1 is housed.
Figure 4:
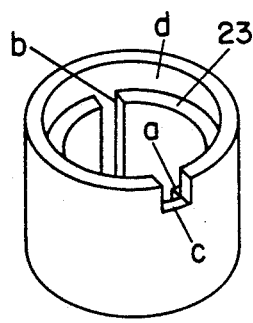
FIG. 4 is a perspective view showing one example of the insulating cylinder shown in FIG. 3.

FIGS. 3 and 4 show the detail of an insulating cylinder (23), as shown in FIG. 1. The insulating cylinder (23) is made of a somewhat rigid insulation material, housed in the annular space between the inner wall of the case (1) and the actuator (4). Insulator (23) insulates the actuator (4) from the case (1), and positions and stops the actuator (4) when it contracts. The actuator (4) comprises, for example, two piezoelectric elements (135 and 136). In the case where each element is connected by leads (137 through 140), the insulating cylinder (23) has in its inner side (as shown in FIG. 4), a groove "a" in which the leads (138 and 139) are laid, a groove "b" in which the leads (137 and 140) are laid, a notch "c" to pull out these leads toward the lid (2), and a groove "d" to pull around and house these leads. Thus, the insulating cylinder (23), inserted between the case (1) and the actuator (4), prevents short circuiting with the case (1) during an insulating breakdown, and eliminates the danger of electrical shock. Further, setting an axial length of the insulating cylinder shorter than the actuator (4) at its expansion, and setting it not shorter than the actuator (4) at its contraction, allows positioning and stopping of the actuator (4). It also eliminates the possibility of an actuator breakdown due to a sudden return motion caused by the spring (6).

Figure 5:
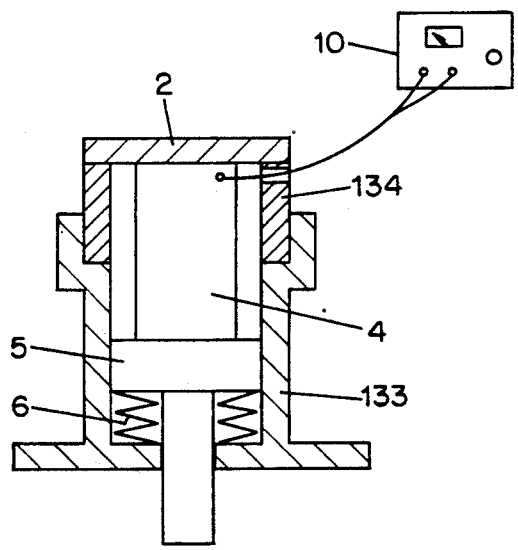
FIG. 5 is a summarized cross section showing an example of an assembly structure of the cylinder device shown in FIG. 1.

FIG. 5 shows the detail of the cylinder case (1) shown in FIG. 1. As shown in FIG. 5, the case (1) is a body which consists of a coupling of an upper case (134) and a lower case (133). One of the cases, (133), is made of a material, ferrous material for example, which has larger thermal expansion than the actuator (4) in the piezoelectric element. The other case (134) is made of a material which has smaller thermal expansion than the actuator (4) (for example, Invar alloy (ferronickel alloy). Using these materials allows an elongation of the case (1) caused by an ambient temperature variation equal to that of the actuator (4). It also reduces variation of the initial extension of the movable piece (5) from an initial fixed plane by an almost negligible extent, which eliminates the need for adjustments. The cases (133 and 134) may be bolted together, or bonded by welding. Furthermore, using ceramic material for the case (134) in place of an Invar alloy (to raise a longitudinal resilience higher than a metallic material) reduces the elongation of the case (1) caused by a load at an operation of the actuator (4). It also prevents operation strokes of the actuator (4) from becoming smaller, and makes the actuator (4) more compact. Using ceramic material provides another advantage—no surface treatment is necessary to prevent rust generation.

Furthermore, making the movable piece (or work piece) (5) of a material having higher longitudinal resilience than ferrous materials (for example, cemented carbide or ceramics), reduces compressive distortion of the movable piece (5) caused by the load of the actuator (4), and prevents its effective operating strokes from becoming smaller.

Next, the press mechanism (as shown in FIG. 1) is explained.

A die is incorporated in a frame (8), self-standing legs (34) are fixed on the frame (8) at its lower part, a pair of cylinder devices (100) are affixed to the frame (8) from both above and below the frame (8) by screws (9), the tips of movable piece (5) on each cylinder device are positioned through the frame (8) so they reach the die to transmit a displacement of the actuator (4). The above legs (34) eliminate the need to provide a special device to hold and mount the processing device, and allow the processing device to function as a press. The die incorporated in the frame (8) eliminates the need to remove the cylinder device (100) when the die is changed.

Within the die section are an upper die (25) and a lower die (26), which hold material to be processed (24) from above and below, and an upper punch (12) and a lower punch (27)—the receiving end of the operating mechanism movement—which shears the material. A spring (28) is disposed in an empty chamber between the punches (12 and 27) and the dies (25 and 26). The spring (28) is pressed to the movable piece (5) in constant contact with the latter. The dies (25 and 26) are pressed against the material to be processed (24) and resiliently held. A flange (collar) disposed on a circumference of the punches (12 and 27) plays the role of a stopper contacting steps of the dies (25 and 26) at this time. This structure thus holds the punches (12 and 27) in the die. Using the spring, the movable piece (5) and the punches (12 and 27), stay in contact with each other to carry out the movement transmission. This structure facilitates replacement of the cylinder device (100) if necessary due to damage or deterioration of the actuator, and facilitates dismantling and assembly of the punches (12 and 27) for regrinding, allowing rapid replacement work.

When the material to be processed (24) requires delivery, a pair of the lower actuator devices (29) disposed below the frame (8) push the upper die (25) up. The device (29) uses a piezoelectric element. Next, when the material (24) requires fixing after having moved, the movable piece of the lower actuator device (29) draws back and returns to the original position. The spring (32) presses the upper die (25) downward through a pair of movable adjusting screws (30) tightened onto the frame (8) by nuts (31) to clamp the material (24). Thus, the spring (32) holds down the material (24) resiliently during the shearing process, and the punches (12 and 27) shear the material. Therefore, the processes reduce deformation of the material (24) such as warping, and because the frame (8) incorporates the lower actuator device (29), the cylinder device (100) does not need to drive a die set. This simplifies the use of the cylinder device (100) to serve one function—drive the punches.

Figure 6:
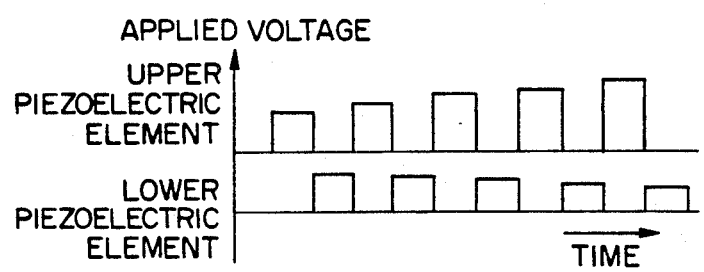
FIG. 6 is a wave-form chart showing an example of a pulse waveform of the voltage applied to the actuator shown in FIG. 1.

FIG. 6 shows an example of a waveform of the pulse voltage to be applied to the actuators (4) in the pair of the cylinder devices (100). The material (24) is set on the dies (25 and 26), and a power source (10) applies a repetitive pulse voltage to the upper and lower actuators (4) at approximately the commercial power supply frequency (50 or 60 Hz). Note the phase difference of 180 degrees between the upper actuator (4) and the lower actuator (4). When the first actuator (4) is on, the other is off and vice-versa as shown in FIG. 6. This makes the actuators (4) expand and contract, which gives power to the punches (12 and 27) The punches (12 and 27) alternatively vibrate the material (24) from above and below (i.e., both sides). As a result, the shearing process proceeds without developing a fracturing phenomenon within material (24), which is finally punched out by dies (25 and 26). The cut face after processing shows very few burrs and/or fracture planes. The press process produces a finished product with a smooth cut face and high precision.

A control of the pulse voltage applied to the actuators (4) in the piezoelectric elements can regulate the operation strokes of the punches (12 and 27) with ease and responsiveness in the order of microns.

B. Second embodiments

Figure 7:
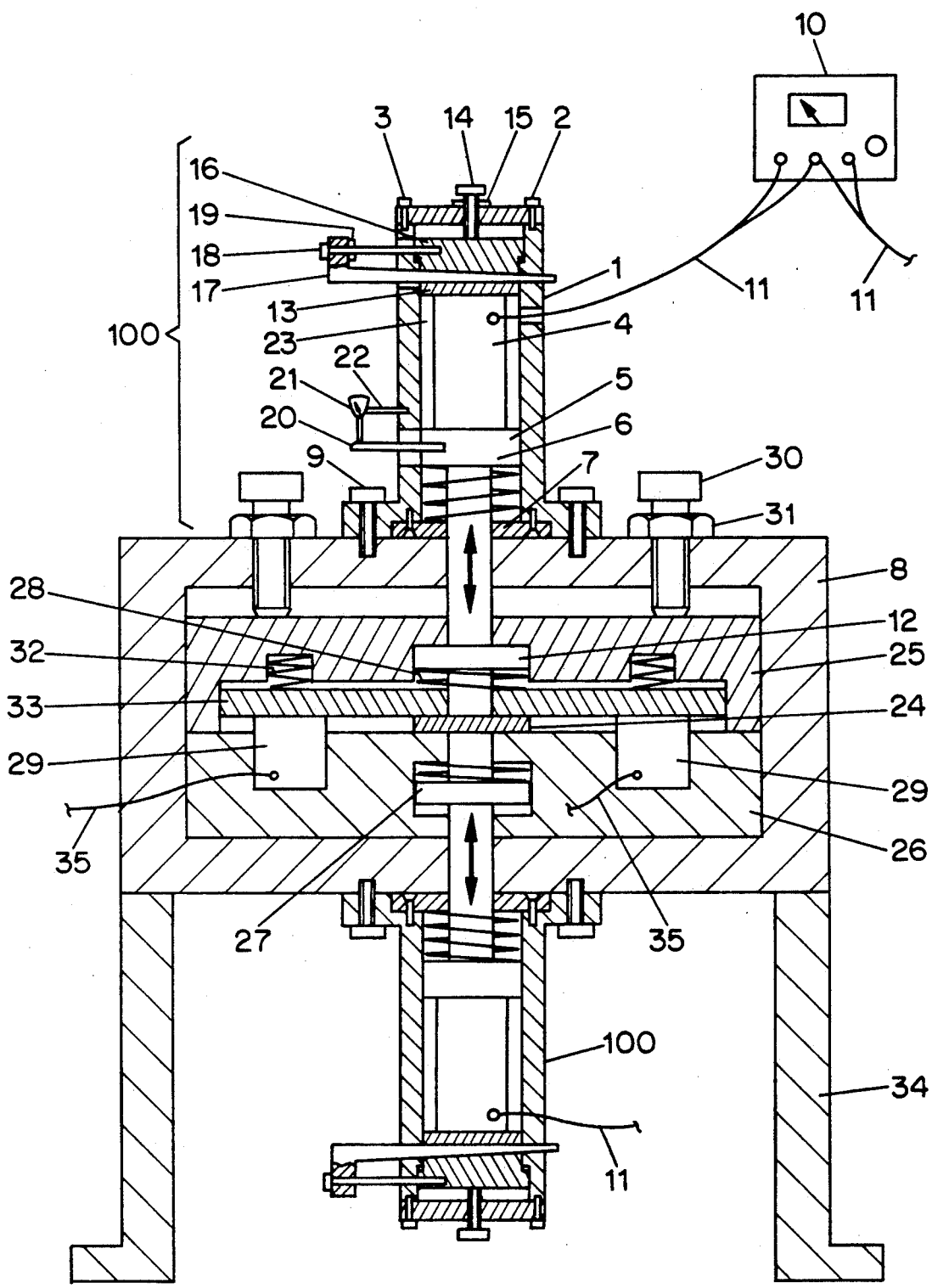
FIG. 7 is a longitudinal cross section showing the entire structure according to the second embodiment of the present invention.

FIG. 7 shows the entire structure of a second embodiment of the present invention In FIG. 7, Part (33) is a movable stopper in the shape of a plate. This is arranged in a recess between upper die 25 and the lower die (26) contained in the frame (8). It has a hole through which the tip of the upper punch (12) passes at its center, and is pressed down by a center spring (28) and a pair of upper springs (32) disposed in recesses in the upper die (25), so as to hold the material between the stopper and lower die (26). Parts (29) are a pair of actuators using layer-type piezoelectric elements to displace the movable stopper (33), which are disposed in a groove in the lower die (26) to hold the movable stopper (33) from below. The adjusting screws (30) are tightened onto the frame (8) by nuts (31), and define the position of the upper and lower dies (25 and 26).

Detailed explanation regarding other structures is omitted as these are the same as the embodiment shown in FIG. 1, including the cylinder device (100).

As explained, the die section used in this embodiment uses the structure of a movable stopper system. When the material (24) requires delivery, the actuator (29) uses a piezoelectric element and, contained in the die, pushes up the stopper (33). During shearing, the actuator (29) draws back to the original position, and the movable stopper (33), pressed by the spring (32), holds down the material (24), thereby reducing a deformation of the material to be processed while it is sheared by the punches (12 and 27). In addition, the die, which incorporates the actuator (29), can simplify the press device body and make it more compact.

Figure 8A:
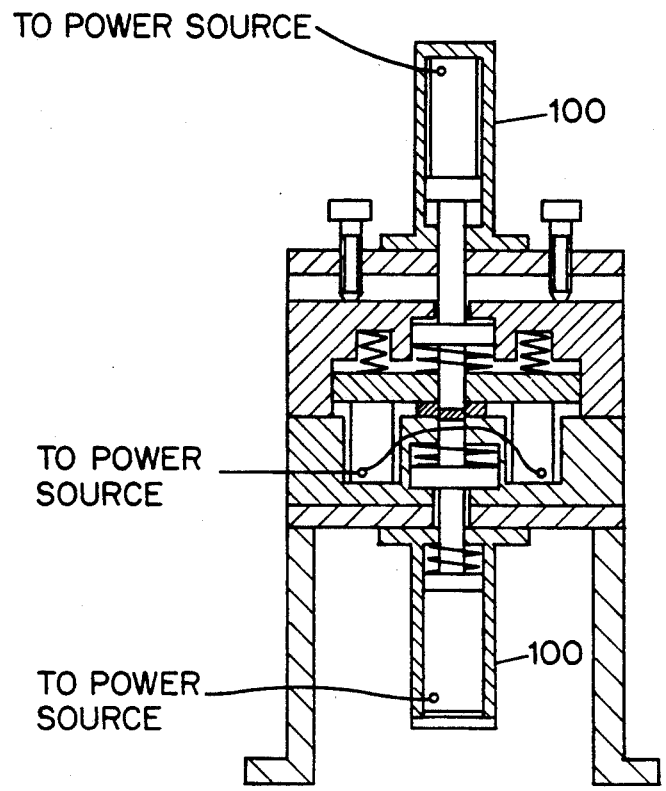
FIGS. 8 (A) and (B) are side cross sectional drawings showing the side structure of the device shown in FIG. 7.
Figure 8B:
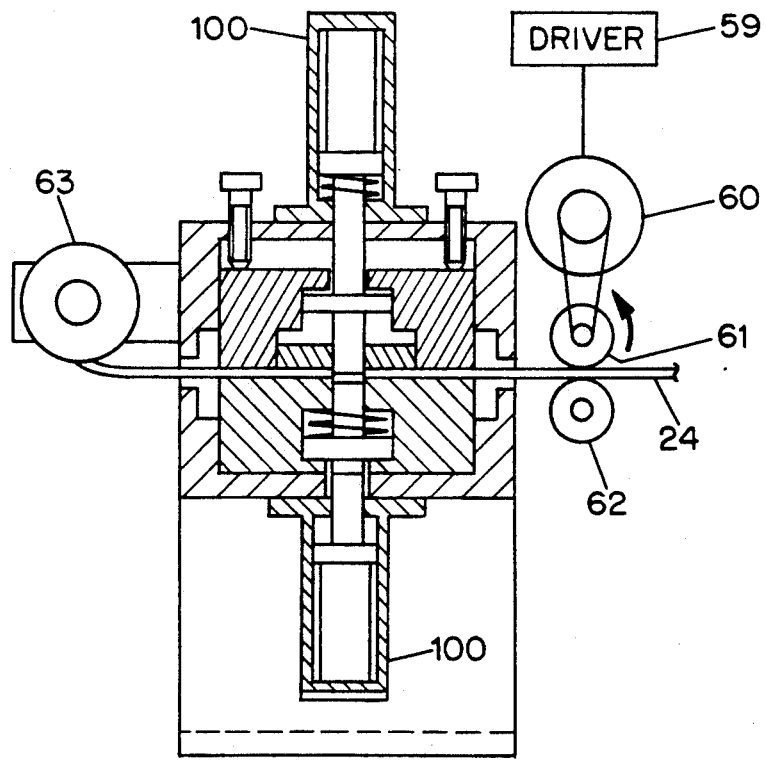

FIGS. 8 (A) and (B) show the side structure of the press shown in FIG. 7. As shown in the figure, the material to be processed is coiled on pulley (63). The material is delivered to the punches (12 and 27) installed in the frame (8), processed and pulled by a pair of delivery rollers (61 and 62), which are directly linked to motor (60), which is driven by a motor driver (59).

Figure 9:
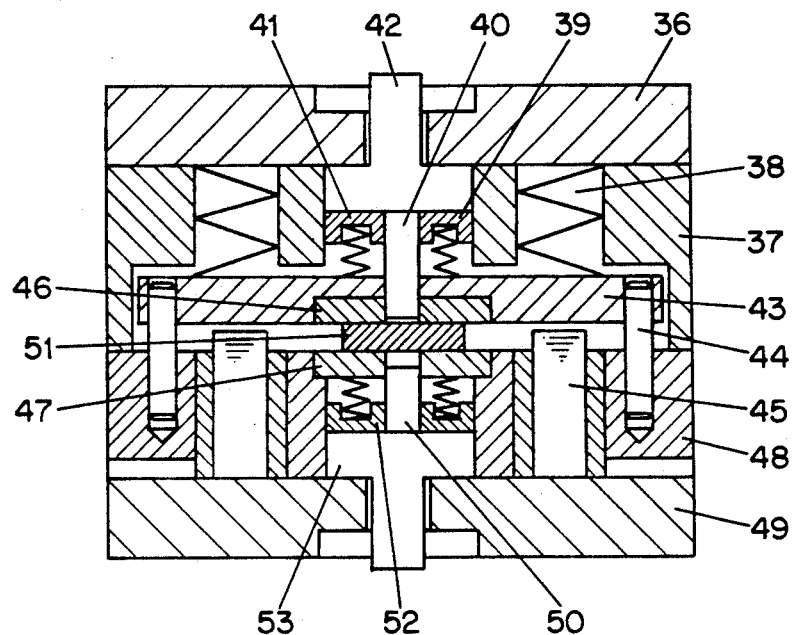
FIG. 9 is a longitudinal cross section showing in detail a press mechanism which is a variation of the second embodiment of the present invention.
Figure 10A:
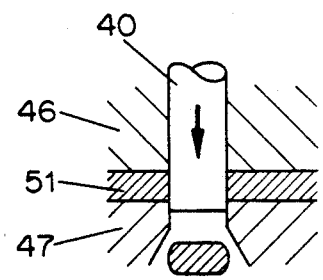
FIGS. 10 (A), (B), and (C) are cross section drawings showing the conventional single punch-out process of the present invention.
Figure 10B:
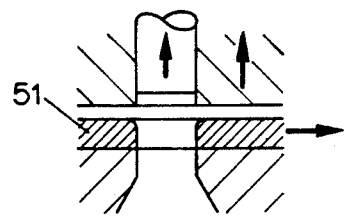
Figure 10C:
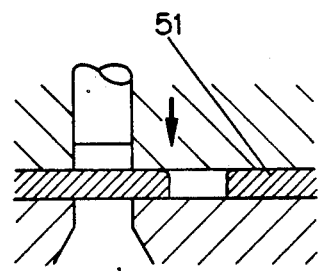
Figure 10D:
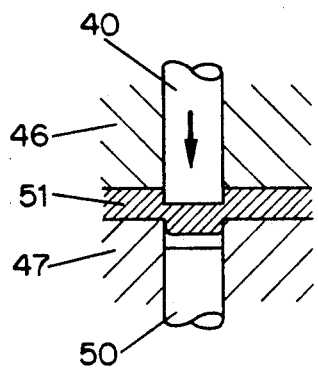
Figure 10E:
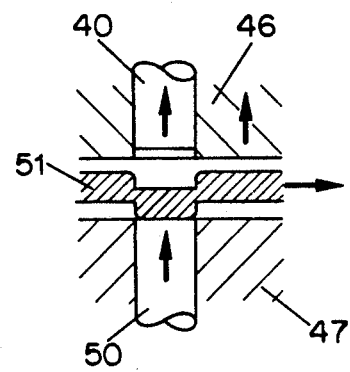
Figure 10F:
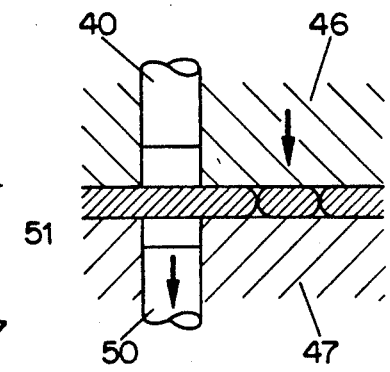

FIG. 9 shows a variant of FIG. 7, particularly the expanded-view detail of a die incorporated in the frame (8).

In the figure, the parts (42 and 53) are punch holders, which contact a movable piece such as the movable piece (100) in the cylinder device (100) (shown in FIG. 1 or FIG. 7), and transmits a displacement of an actuator (4) to an upper punch (40) and lower punch (50). An upper die backing plate (36), fixed on upper die sets (37), functions as a stopper for a pair of stopper springs (38) and one upper punch holder (42). It is possible to structure the upper die backing plate (36) and the upper die sets (37) as an integral part. However, to maintain the high precision processing of the face to work as a stripper, it is best to structure them separately, so that the stripper face can be ground independently. An upper punch (40) is held to the punch holder (42) by a punch presser (41), and this punch holder (42) is resiliently held by a punch spring (39) through the punch presser (41).

A lower die backing plate (49), fixed on lower die sets (48), functions as a stopper of a pair of actuators (45) using piezoelectric elements and one lower punch holder (53). It is possible to structure the lower die backing plate (49) and the lower die sets (48) as an integral part. However, they can achieve high precision when separated, for the same reason as for the upper die. The lower die sets (48) have a pair of guide pins (44) disposed in the vertical grooves, with the guide pins (44) guiding the stripper (43). The lower die set (48) has a lower die (47) set on it, and the upper die set (43) has an upper die (46) set on it.

The stripper spring (38) keeps the stripper (43) pushed down, material to be processed (51) is loaded into the space between the upper die (46) and the lower die (47), and the stripper spring (38) holds down the material (51) by its resilience. The movable piece (5) pushes the punch holder (42 or 53), and the upper die (46) or the lower die (47) shears the material (51). The upper die (46) and the lower die (47) also guide the upper punch (40) and the lower punch (50). To deliver the sheared material (51) to the next shearing process, an external power source applies a pulse voltage to the actuator (45) to expand it in order to push up the stripper (43) and make the material (51) free, which is moved by an external material delivery device.

FIG. 10 explains the difference between the conventional single punch-out process and the flat punch-out process, the latter being used in the embodiment of the present invention.

The single punch-out method, used in the conventional process, as shown in FIGS. 10 (A), (B) and (C), generates punching burrs. To prevent burr generation, material is sent in a half-punched condition to the die where a flat punch-out is carried out while a movable stripper holds down the material to complete a punch-out, consuming the same amount of time as the single punch-out process, but with no burrs. This is called a flat punch-out method.

In a flat punch-out process, the upper punch (40) first half-punches the material to be processed (51), as shown in FIG. 10 (D). Then, as shown in FIG. 10 (E), the upper punch (40), the upper die (46) and the lower punch (50) rise, and the lower die (47) pushes out the material so that it can be moved. Thereafter, an external delivering device moves the material to the next shearing position. Then, as shown in FIG. 10 (F), the upper die (46) descends to crush the half-punched part of the material, generate cracks in the part not cut by shearing, and thereby completing the shearing. Then, the process returns to the one shown in FIG. 10 (D), and repeats the cycle. This process allows a no-burr shearing without punching the material from above and below, with the same processing speed as in the single punch-out method, or it may eliminate the lower punch.

C. Third embodiment

Figure 11:
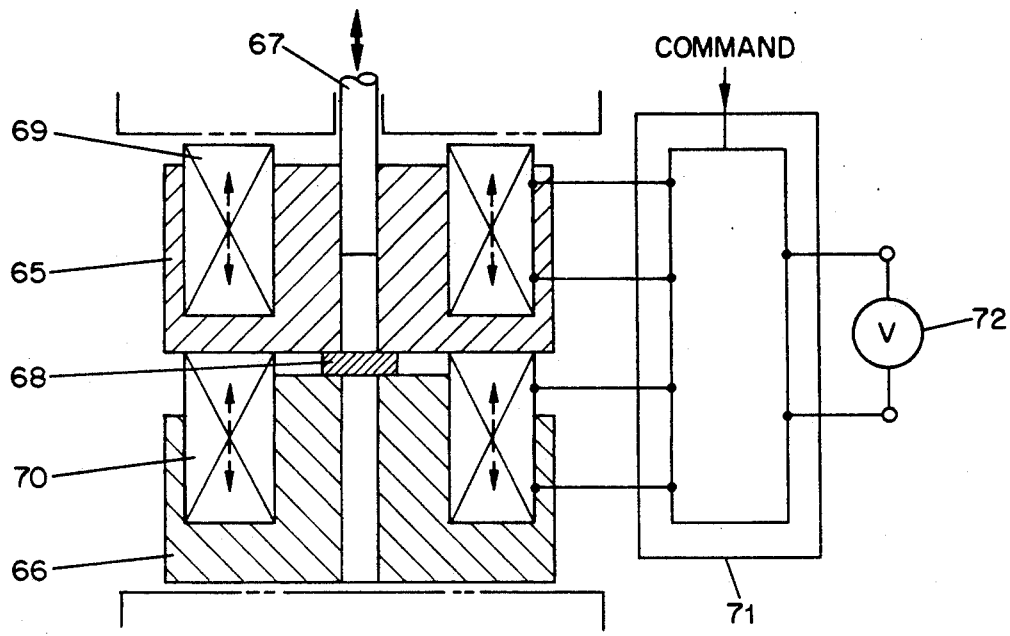
FIG. 11 is a longitudinal cross section showing the structure according to the third embodiment of the present invention.
Figure 12:
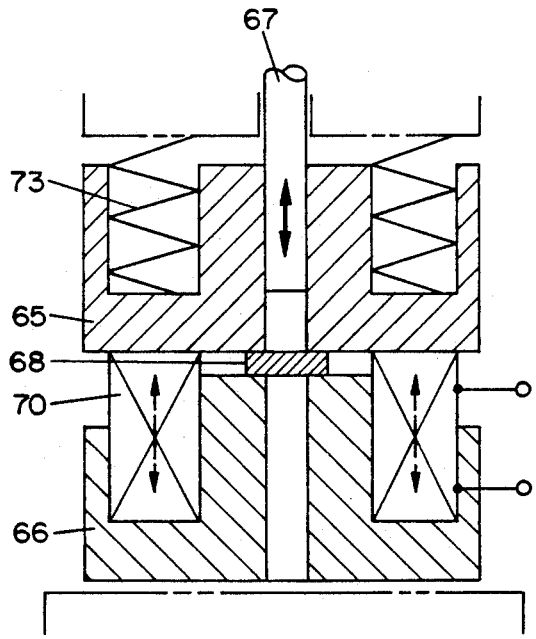
FIGS. 12 and 13 show variations of the third embodiment of FIG. 11.
Figure 13:
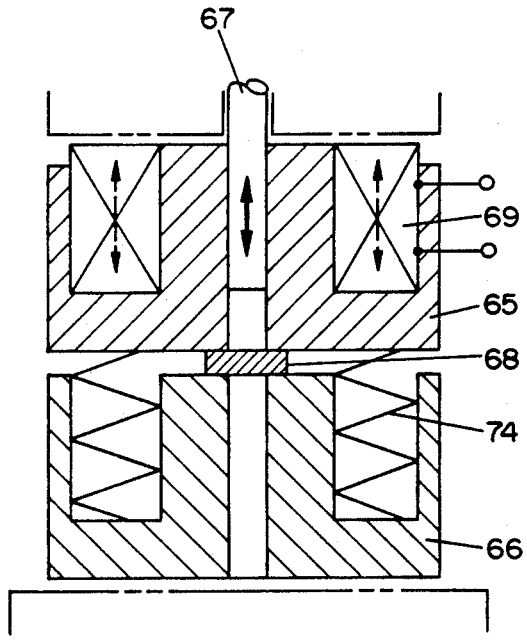
Figure 14:
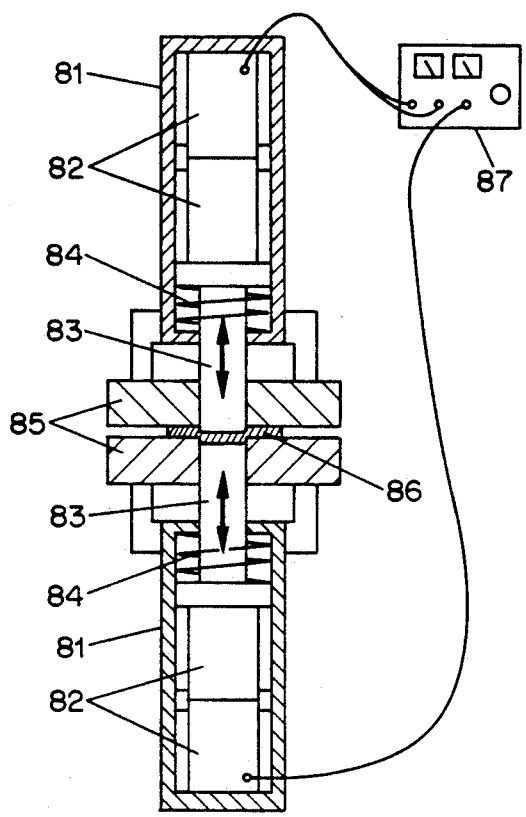
FIGS. 14 and 15 are longitudinal cross sections showing the structures of piezoelectric devices.
Figure 15:
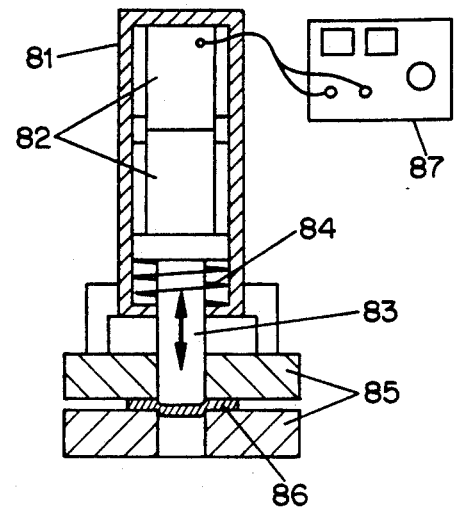

FIGS. 11, 12 and 13 show a third embodiment of the present invention and various patterns of arrangement of an actuator to hold and set a material or part at a predetermined position in an assembly jig.

First in FIG. 11, the lower die (66) incorporates the piezoelectric element (70), and the upper die (65) incorporates the piezoelectric element (69) as a die-opening actuator and a die-closing actuator, respectively. The piezoelectric elements (69 and 70) are connected to the output terminals on the controller (71).

This structure operates a press in the following manner. When the controller (71) receives a press operation command, the controller operates the power source (72) to supply a voltage to the piezoelectric element (70) incorporated in the lower die (66). This makes the piezoelectric element (70) expand in the directions shown by the broken lines as a result of the piezoelectric effect, and it operates by its drive power a die opening operation which pushes up the upper die (65).

When a notch delivery is completed for the material (68) loaded (brought) between the lower die (66) and the upper die (65), the controller stops the voltage supply to the piezoelectric element (70) and at the same time supplies a voltage to the piezoelectric element (69) incorporated in the upper die (65). This makes the piezoelectric element (69) expand in the directions shown by the broken lines and operate by its drive power a die closing operation which holds the material (68) between the lower die (66) and the upper die (65).

Next, in this die-closed condition, the punch (67) strokes in the directions shown by the arrow mark to punch out the material (68). The controller then stops the voltage supply to the piezoelectric element (69), completing one cycle of a press operation. This process is repeated to punch (or press) the material (68) continuously.

FIGS. 12 and 13 show variations of the case shown in FIG. 11. In the case of FIG. 12, the lower die (66) incorporates the piezoelectric element (70) as a die opening actuator in the same manner as the embodiments shown in FIGS. 1, 7 and 9, where the spring element (73) incorporated in the upper die (65) is used to close the die. In contrast, FIG. 13 shows a case where the upper die (65) incorporates the piezoelectric element (69) as a die closing actuator, and the spring element (74) incorporated in the lower die (66) is used to open the die.

The cases described above referring to FIGS. 12 and 13 also use piezoelectric elements (69 and 70) as actuators, as in the case of FIG. 11, to open and close the press die. These actuators using piezoelectric elements respond instantaneously when a voltage is applied from an external source. This provides an advantage in controlling operations linked with the main press mechanism, because the timing of the operation of the control signals is simplified.

While the illustrated embodiments describe cases using press dies, the assembly jigs in specialty parts assembling machines may produce the same effects when they incorporate piezoelectric elements as jig actuators, as done in the embodiments of the present invention.

Because a piezoelectric element is used as an actuator to utilize the displacement generated from its piezoelectric effect to set a material or a part in a predetermined position, the structure is simpler in construction and faster in operational response then a conventional mechanical actuator using a hydraulic or air cylinder and is also capable of accurate operational timing (synchronization) with electric signals. When the described structure is used, especially in a die closing mechanism of a press die, it greatly simplifies the mechanical structure of the mechanism and facilitates electrical synchronization with the main press mechanism, thus leading to practical advantages in actual use of the machine.

D. Fourth embodiment

Figure 16:
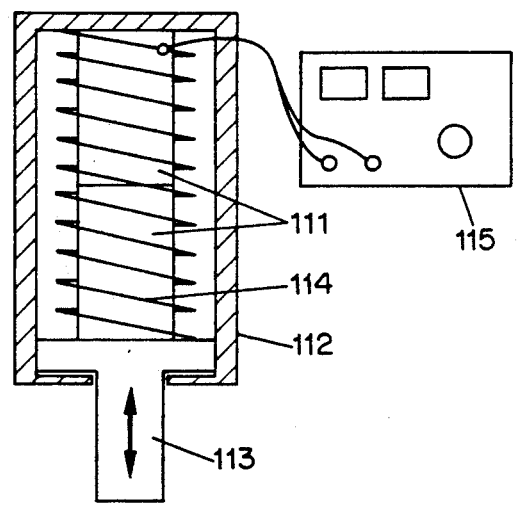
FIG. 16 is a longitudinal cross section showing the structure of an actuator of the fourth embodiment of the present invention.

FIG. 16 shows the structure of an actuator according to the fourth embodiment of the present invention.

This embodiment uses a system where a plurality of thin piezoelectric ceramic sheets are laminated, internal electrode foils are located in each layer of the laminate, a layer-type piezoelectric element (111) with piezoelectric ceramics connected in parallel electrically by an external electrode located in a cylindrical case (112), and a movable piece (or work piece) (113) to transmit displacement to an external source bonded to the layer-type piezoelectric element (11). Furthermore, a coil spring (114) that is either bolted or welded between the movable piece (113) and the bottom of the cylindrical case (112) is present, of appropriate length to preload, the layer-type piezoelectric element (111) which is located on the inner side of the coiled spring (114).

This structure in this embodiment keeps the layer-type piezoelectric element (111) constantly under compressive stress. Now, the total length of the piezoelectric actuator, using a layer-type piezoelectric element of the same shape as conventional elements obviously becomes shorter than the conventional structure, where a coil spring is inserted in series with the piezoelectric element.

According to results of experiments, a high precision displacement control was possible, on the order of microns, as in the conventional cases, when a voltage regulating power source (115) supplied an adequate voltage to the layer-type piezoelectric element (111).

F. Fifth embodiment

Figure 17:
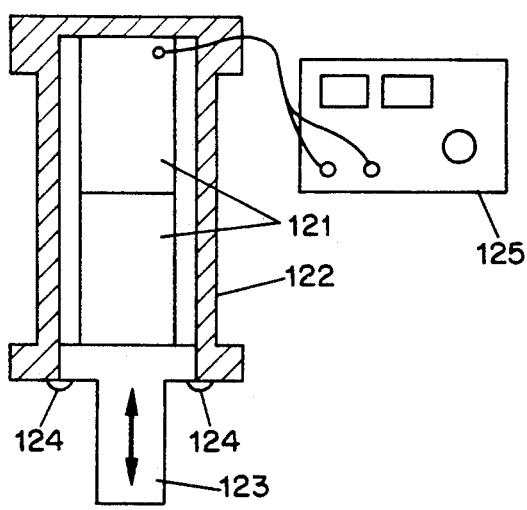
FIG. 17 is a longitudinal cross section showing the structure of an actuator of the fifth embodiment of the present invention.

FIG. 17 shows the structure of an actuator according to the fifth embodiment of the present invention, which has approximately the same functional effect as the embodiment shown in FIG. 16.

In this embodiment, layer-type piezoelectric elements (121) are housed in a cylindrical case (122), and a movable piece (123) is arranged so as to be bonded to the layer-type piezoelectric element (121), as in the case of the above fourth embodiment. In this embodiment, the side wall of the cylindrical case is used as a resilient element by making the wall thin enough to make its equivalent spring constant about one tenth the value of the spring constant of the layer-type piezoelectric element. Furthermore, a sliding section of the movable piece (123) is welded to the cylindrical case (124) to fix the movable piece (124) to the case with the layer-type piezoelectric element (121) kept in a compressive stress through the movable piece (123).

The structure in this embodiment keeps the layer-type piezoelectric element (121) constantly under compressive stress. Now the total length of the piezoelectric actuator becomes much shorter than the case where the coil spring is arranged in series with the piezoelectric element, as has been practiced conventionally.

According to an experiment, high precision displacement control was possible, on the order of microns as in the conventional cases, when an adequate voltage is supplied to the layer-type piezoelectric element (121), as in the case of the fourth embodiment.

As described above, the present invention provides the following benefits:

1. The piezoelectric element used in the actuator comprises a plurality of layers of piezoelectric ceramic sheets made of such materials as barium titanate porcelain. As is well known, when an electric field is applied, a piezoelectric element distorts itself via the piezoelectric effect in response to the direction of the electric field Structuring the distorting direction to match the laminating direction of the piezoelectric ceramic sheets will create a relatively large elongation displacement for the piezoelectric element as a whole. Therefore, if the piezoelectric element is incorporated in a press die or an assembly jig as an actuator and operated on electric signals to open and close the die and/or close the assembly jig, material or a part loaded on the press die or the assembly jig can be clamped in a predetermined position in the press die of the assembly jig. Its operation response time is much faster than by a hydraulic or air cylinder, and the operation can be timed directly with electric signals.

Therefore, because the actuator uses a piezoelectric element to perform an actuator operations involving displacement generated by the piezoelectric effect for clamping a material or part in a predetermined position:

a. the system simplifies the conventional structure of a mechanical actuator using a hydraulic or air cylinder, improves the operation response time and can take the operation timing directly from electric signals; and b. when applied and implemented particularly in a die closing mechanism of a press, the system greatly simplifies the structure of the die closing mechanism and facilitates timing of the operation of the die closing mechanism with that of the press, thereby providing practical advantages.

2. In a press device, which uses an actuator with a piezoelectric element as a punch drive source, a movable stopper made of a resilient (i.e. stiff) material is located in a die (press die) to hold down the material to be processed in a shearing process. And a clamping actuator using a piezoelectric element is located in the die independent from the punch drive source to return the movable stopper to its initial position. Therefore, the punch shears the material while the movable stopper holds it down thus reducing deformation of the material, such as warping. Moreover, incorporating the actuator in the die makes the press processing device body more compact and allows the actuator as the punch drive source to perform all of the stroke operations of the punch, so that it is not necessary to drive a die set.

3. In a press processing device, which uses an actuator with a piezoelectric element as a punch drive source, when the actuator needs to be replaced because of damage or deterioration, the system allows for replacement without having to dismantle the die section. This facilitates dismantling of the punch for grinding by making the actuator with a piezoelectric element and the punch contact, and using the resilient element to press and hold the punch on the actuator in the die.

4. In a press device that uses an actuator with a piezoelectric element as a punch drive source, the system eliminates the need to remove the actuator at a press die exchange, and facilitates work to shear materials having different shapes, by using a frame to fix the actuator and incorporating the die into the frame.

5. In addition, in a press processing device that uses an actuator with a piezoelectric element as a punch drive source, the present system eliminates the need to build special mounting apparatus for the device and allows for fabrication of the device at a lower cost because of self-standing legs at the bottom of the frame or the die.

6. The displacement of the piezoelectric element is transmitted externally through a movable piece, rather than by coupling the piezoelectric element with an external device, and a guide plate to guide this movable piece is removably attached to side of the case. Therefore, the actuator assembly takes a single and independent form. This allows for easy replacement without having to dismantle the mechanism having then the piezoelectric element and the movable piece if the piezoelectric element is damaged or deteriorated or the movable piece is worn out and requires replacement.

7. In addition, because the insulating element, also functioning as an axial stopper to stop the movable piece, is interposed between the piezoelectric element and the case, the actuator is positioned accurately and safely within the case, thereby eliminating the danger of electrical shock to persons touching the case.

8. Furthermore, a displacement transmitting piece for measuring the stroke of the piezoelectric actuator which is located on the movable piece and projects externally from the opening in the case wall, measures the stroke directly and accurately on the actuator side.

9. A position adjusting mechanism, which is capable of variably adjusting the mounting position of the movable piece both in coarse and fine adjustments and is located on the case end, allows an operator to accurately adjust the extension amount of the movable piece after the piezoelectric element is set.

10. The case is formed with two kinds of material, one having a lower thermal expansion coefficient and another having a higher thermal expansion coefficient than that of the piezoelectric element to nearly equalize elongation of the piezoelectric element with that of the case during ambient temperature variations. Therefore, the structure eliminates variation in the extension length of the movable piece from its fixed plane caused by temperature variations, and drives the actuator in an initially set condition without the need of adjustments regardless of the ambient temperature variation.

11. The use in a portion of the case of a ceramic material that withstands high deformation loads enables, together with the function described in Item (1) above, to reduce elongation of the case caused by the load when operating the piezoelectric element and prevents the operation stroke from becoming smaller, thus allowing for a more compact actuator and eliminating the need for rust prevention treatment on the case surface.

12. Structuring the movable piece with high longitudinally resilient materials having higher longitudinal elasticity (i.e. stiffness) than steel, such as cemented carbide or ceramic, reduces the compressive distortion of the movable piece caused by the load when operating the piezoelectric element, thereby preventing the effective operation stroke from becoming smaller, making the actuator more compact, and eliminating the need for rust prevention treatment on slides and reducing the slide play if a ceramic material is used.

13. Connecting the piezoelectric element in parallel with a resilient element to apply a constant compressive stress to the piezoelectric element makes the total length of the piezoelectric actuator shorter than the conventional actuator connected in series, thus making possible the construction of a more compact actuator.

HIGH PERFORMANCE PIEZOELECTRIC ACTUATORS

The following considerations are particularly relevant to piezoelectric actuators intended to achieve high performance in areas including more effective work piece drive, increased accuracy of work piece positioning, maximization of work piece drive stroke length, increased work piece drive repetition frequency and repeatability of performance.

Figure 18:
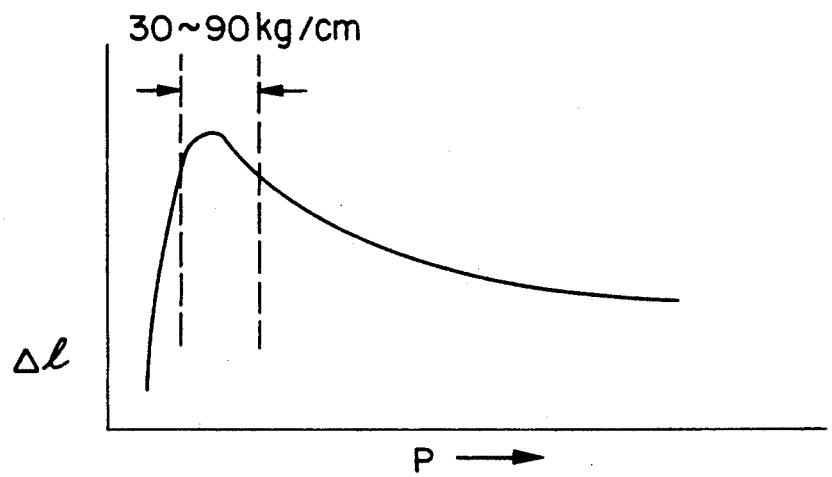
FIG. 18 is a graph showing maximum piezoelectric actuator stroke as pre-loading is increased.

It has been discovered that when a piezoelectric actuator is activated in an application in which a significant force is exerted by a laminated piezoelectric, a substantial compression of the piezoelement takes place before the work piece is displaced. It has been determined that this results from the basic construction of a laminated piezoelement, wherein a plurality of piezo-material laminations are stacked with bonding material between the laminations. Because the laminations are not perfectly uniform in thickness (i.e., their surfaces are not perfectly parallel) and with the presence of the bonding material, in a high force application the length of the drive stroke is diminished by the initial compression of the piezoelement. Thus, as the piezoelement is activated, first it compresses against the load and then it begins to displace the load. As will now be discussed in more detail, in accordance with the present invention work piece, displacement is maximized to increase the work piece drive stroke, by appropriate pre-loading of the piezoelectric actuator. FIG. 18 shows the maximum displacement (stroke) of a piezoelectric actuator as the pre-load is increased. It can be seen from this figure that an optimum range exists for the pre-load P between about 30 to 90 kg/cm$^2$.

Figure 19:
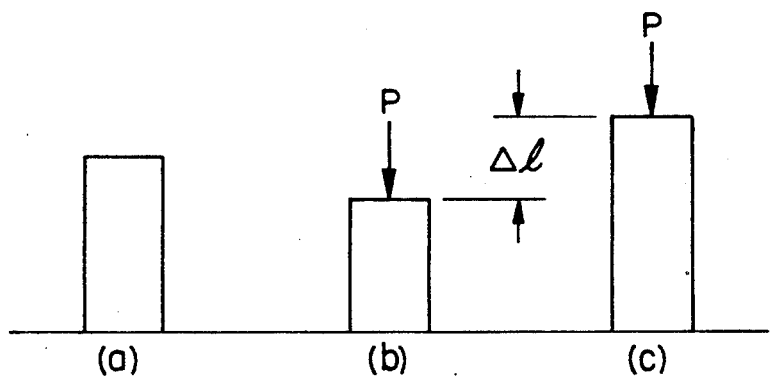
FIG. 19 compares the length of an un-loaded piezoelectric element (a) and a pre-loaded element (b) with the length of an element (c) after voltage application.

The maximum displacement $\Delta l$ is shown in terms of an elongation of the piezoelectric element when activated with a voltage of 400 volts, for example, when it is loaded with a pre-load P, as shown in FIG. 19. This voltage may be higher or lower depending on actual piezoelectric element construction and thickness of the laminations in the piezoelectric elements. It will be seen that $\Delta l$ between the pre-loaded and activated elements at (b) and (c) in FIG. 19, is substantially larger than the change in piezoelement length between the un-loaded and activated elements represented at (a) and (c) in FIG. 19.

Figure 20:
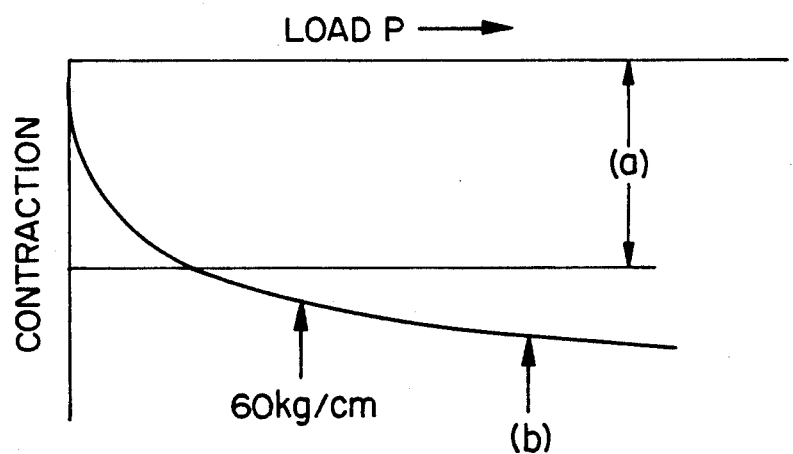
FIG. 20 is a graph showing the relation between the level of pre-loading and the piezoelectric element contraction followed by the start of material deformation.
Figure 21:
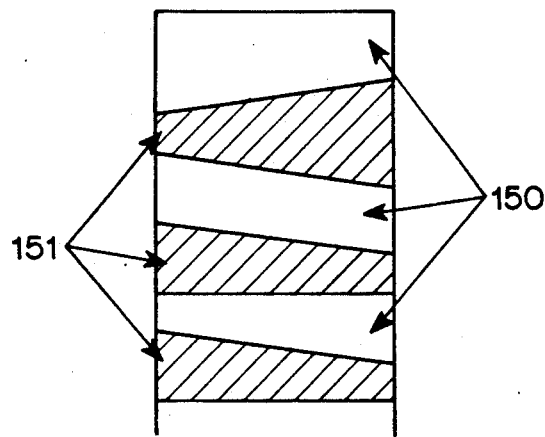
FIG. 21 is a representation of a piezoelectric element in cross-section to show imperfect parallelism of laminations of piezo material stacked with bonding material between laminations.

For further understanding of the reason for the existence of the optimum range for this pre-loading of the piezoelectric element, reference is made to FIG. 20, which shows the relation between the load and the compression, or contraction in length, indicated at (b) in FIG. 19. It was discovered that, with a small preload, as the piezoelectric element is activated, the work piece is not displaced until the element is compressed to fill the gaps between laminations resulting from inclination of lamination surfaces relative to each other. As a result, the length of the work piece drive stroke available for external application is decreased, because it is partially used to compress the element before enough force is generated to displace the external load. FIG. 21 represents a cross-sectional view of a piezoelectric element, with piezo-material laminations 150 bonded together by bonding material 151 in a non-loaded condition. In FIG. 20, (a) represents the deformation of an elastically deformed laminated piezoelectric element to the point at which the bonding material 151 is compressed to permit contact between laminations 150. In FIG. 20, (b) represents the load point at which the piezoelectric element is fully compressed, so that substantial material deformation starts at this point, which represents the maximum amount of axial compression by non-destructive application of compressive force to the piezoelective element. It will be appreciated that the actual force at this point will vary depending on the size, construction and parallelism of laminations of the piezoelectric element.

To effectively pre-load a piezoelectric actuator to make available substantially the full $\Delta l$ stroke, the size of a pre-load needs to be one to two orders of magnitude times the force to move the movable work piece. Thus, the force to displace the work piece corresponds to 10% to 20% of the force needed to realize the element compression shown at (b) in FIG. 19 by means of loading the piezoelectric element from the condition shown at (a) in FIG. 19.

A pre-loading force of 60 kg/cm$^2$ has been used, but it may be considered that the maximum displacement can be achieved with pre-loading in the range of about 30 to 90 kg/cm$^2$ in practical applications, and also that the optimum value may vary because of the internal structure of the piezoelectric unit. It should be noted that these pre-loading values are significantly larger than those used in prior devices, which may reach a loading in the range of 20 kg/cm$^2$.

If all the parts could be processed in perfect parallelism, no load as large as that described above would be required because the lamination surfaces would be parallel, with very little material between them. However, industrial production requires the acceptance of parallelism errors in the range of 5 to 10 μm; otherwise, the production costs rise, making production impractical. Since this tolerance creates clearances of tens of μm in piezoelectric actuator units in accordance with the invention, the spring means, illustrated at 6 in FIGS. 1 and 3, for example, is selected to provide appropriate pre-loading when the piezoelectric actuators are assembled.

When used in a piezo-press, a high-speed response action is required. Therefore, unless the resonant frequency in the mechanical system of the movable work piece and the pre-loading spring is raised higher than 1 KHz, no high-speed action is possible, and problems in practical use arise. In this respect, while it is considered that the cycling rate of piezoelectric elements is generally in the range of 1 to 10 KHz, the response is poor in piezoelectric elements that have a large output load of the order of several thousand kilograms, for example. In such applications, it is acceptable if the mechanical system has a response of 1 KHz or more.

As a means to raise the resonant frequency in the spring system, the movable mass could in theory be made lighter, or the spring constant for the pre-loaded spring could be increased. However, decreasing the weight has been found to be not practical because of the following. Lighter work piece materials such as aluminum, for example, have a modules of longitudinal elasticity smaller than that for steel material and thus larger contraction because of loading during operation. This generates loss in the operational stroke of the work piece, which is a disadvantage. If the thickness of a steel work piece is thinned enough to reduce the weight, and thereby increase the resonant frequency, longitudinal changes under pressure will again cause loss in the stroke actually delivered by the work piece.

Therefore, in accordance with the invention, the spring constant for the pre-loaded spring is increased. Considering the extension and contraction of a piezoelectric element, if the piezoelectric element is displaced in a sinusoidal waveform, the displacement of the piezoelectric element synchronizes with the movement of the movable piece up to an operation frequency in the vicinity of the resonant frequency, regardless of the pre-loading force for the spring, and can be driven at a high speed. However, in order for the piezoelectric element to actually displace the work piece in extension and contraction in a sinusoidal waveform, the applied voltage must follow a special waveform which would make the driving power supply circuitry more complex and expensive. This has been found to be true, because simply applying a sinusoidal voltage to a piezoelectric element will displace the element in close to a trapezoidal waveform as a result of the hysteresis inherent in the piezoelectric element. Since a piezo-press suffices if it can achieve 4 to 5 positionings (digitally), it has been found acceptable to use a square wave drive, which is simple in circuitry and low in cost.

Figure 22A:
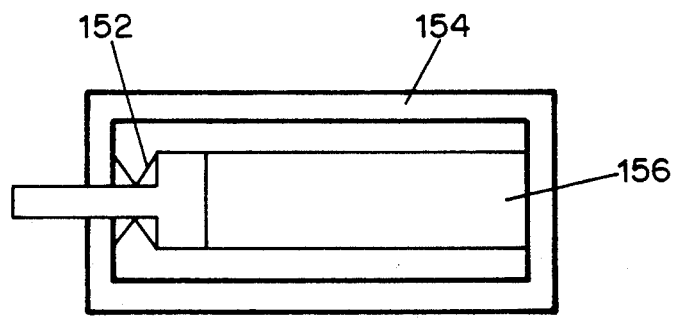
FIGS. 22(A), (B) and (C) respectively show representations of an activated actuator with expanded piezoelectric element, rapid contraction of the element on deactivation, and impact points as the spring re-positions the piezoelectric element.
Figure 22B:
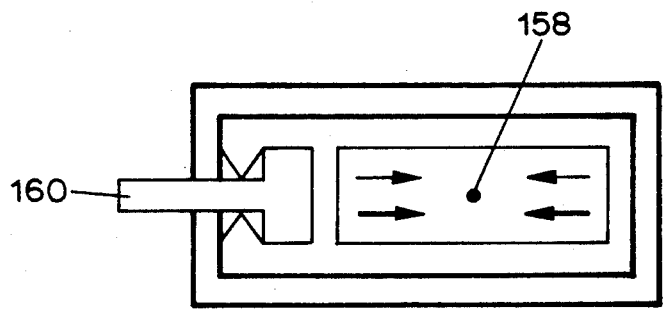
Figure 22C:
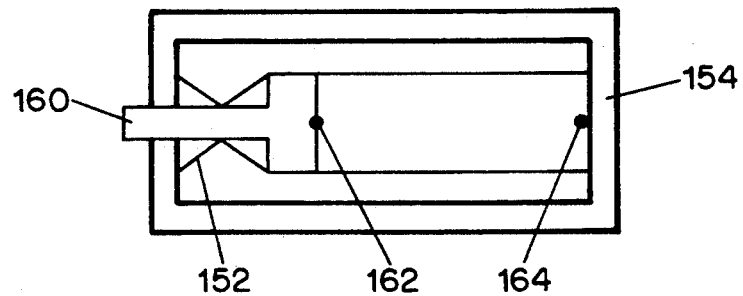

A square wave drive causes a piezoelectric element to contract at so high a speed that the movable piece cannot follow it, and this results in a clearance as shown in FIG. 22(B) at each end of the element 156 FIG. 22(A) shows the piezoelectric element 156 activated to fully displace the work piece 160 and FIG. 22(B) shows the element 156 rapidly contracted by the square wave excitation voltage. As shown, the element contracts rapidly around its center of gravity 158, pulling away from both the end of the case 154 and the work piece 160. Then, the movable piece is retracted by the spring 152 and impinges upon the piezoelectric element as shown in FIG. 22(C), resulting in impact points 162 and 164. After impact, the movable piece bounces back because of the reaction force. These movements are repeated until they decrease gradually to a static condition. The movable piece bounces very little at the first impinging point 162, but moves forward, pushing the piezoelectric element. When the element strikes the case at the second impinging point 164, the reaction force is transmitted to the movable piece, making it bounce. If the movable piece is given a small pre-load, it bounces substantially and the amplitude may actually be increased. This makes the vibration continue for so long that the movable piece is not in position for the next activation cycle. Therefore, in accordance with the invention the pre-load is increased to an amount sufficient to cause the vibration to decay in several impingements. Assuming the resonant frequency to be 1 KHz, the several vibrations last several milliseconds, which does not present any practical problem. Friction between the movable piece and the guide acts as the decaying force.

Thermal expansion in a piezoelectric element is negative at room temperature (i.e., this length contracts as the temperature increases). If the side-wall of a cylinder case is fabricated using ordinary steel, for example, 45 μm of the stroke of a typical stroke actuator can be absorbed when the temperature is varied by 10° C. This means that for a typical piezoelectric element actuator about 30% is lost out of a stroke of 150 μm, and only a stroke of 100 μm can be obtained for actual use. In addition, the precise positioning performance of the piezoelectric element is lost, and an important problem is presented in practical use, because of the deviation in the referenced position.

Therefore, in piezoelectric elements in accordance with the invention, this problem can be solved by use of cylinder case materials having low thermal expansion. The effect of the thermal expansion can be reduced to zero if the proper combination is employed so that the sum of expansion in the piezoelectric element and the movable work piece is equivalent to the expansion of the case. If, for example, the thermal expansion of the movable work piece is made larger than that of steel, an actuator unit having no variation due to thermal expansion can be fabricated even if steel is used for the case.

The foregoing description of actuator pre-loading, when considered in viewing piezoelectric actuator 100 in FIG. 1, enables provision in accordance with the invention of a self-contained pre-loaded piezoelectric actuator for repetitively displacing work piece 5 from a reference position. As shown in the reference position, the bottom end of work piece 5 is immediately adjacent to the upper surface of upper punch 12, without displacing punch 12 from its retracted position As shown, actuator 100 includes a piezoelectric element 4 for displacing work piece 5 and element 4 is constructed of a plurality of laminations in an axial stack as illustrated in FIG. 21. As a result, element 4 is compressible by a predetermined axial amount by non-destructive compressive force, as can be determined by a combination of non-destructive and destructive testing to determine the characteristics of particular forms of piezoelectric elements. Work piece 5 is positioned at a first end, i.e., the lower end as shown, of element 4.

In accordance with the invention, the FIG. 1 actuator 100 also includes support means shown as case 1 for supporting the element 4 and work piece 5. As shown, case 1 includes a lower end 7, with a central opening acting as a work piece guide, and an upper end member 2 for restraining the second (upper) end of element 4. Actuator 100, as shown, further includes resilient means, shown as coil spring 6, resiliently coupling work piece 5 and element 4 to end member 2 of case 1. As shown and as described above, spring 6 is operative to pre-load the element 4 by applying sufficient force to compress the element 4 by substantially the predetermined axial amount discussed above as the axial amount by which the element 4 is compressible by non-destructive compressive force.

In the FIG. 1 actuator, the lower end (including the work piece guide in the form of a hole permitting movement by work piece 5) comprises retaining means for retaining the spring 6, work piece 5 and element 4 within case 1, with element 4 held in a pre-loaded condition. The FIG. 1 actuator 100 further includes attachment means, shown as the mounting flange portion of case 1 which is traversed by bolts 9. The attachment means enables the attachment of case, and thereby actuator 100, in an operating position on frame 8 of the press shown. Other details and characteristics of the actuator 100 and its operation are described more fully in the preceding portions of this specification.

A method for pre-loading a piezoelectric actuator in accordance with the invention includes the following steps:

(a) providing a form of piezoelectric actuator as described above, including a form of laminated element whose axial length may be shortened by compressive force;

(b) determining the amount of compressive force necessary to produce substantially the maximum shortening of the axial length of the element when subjected to non-destructive compressive force;

(c) providing spring means able to exert a pre-loading force of substantially the amount of compressive force determined in step (b); and (d) assembling the actuator unit to provide a pre-loaded piezoelectric actuator unit substantially free of work piece displacement loss (i.e., work piece drive stroke length diminution) due to piezoelectric element compression under load.

As described above, methods using the invention may also provide pre-loading effective to limit actuator element vibration (i.e. mechanical oscillation) on rapid contraction of a piezoelectric element at the time of deactivation by a rapid decrease in applied voltage, as would result from use of a square wave activation/deactivation voltage, for example.

The invention is therefore claimed in any of its forms or modifications within the legitimate and valid scope of the claims.

We claim:

1. A self-contained pre-loaded piezoelectric actuator unit, for repetitively displacing a work piece from a reference position, comprising:

a piezoelectric element, including a plurality of laminations in an axial stack which is compressible by a predetermined axial amount by non-destructive compressive force, for displacing a work piece;

a work piece positioned at a first end of said piezoelectric element;

support means, for supporting said piezoelectric element and said work piece, including an end member for restraining a second end of said piezoelectric element;

resilient means, resiliently coupling said work piece and said piezoelectric element to said end member, for pre-loading said piezoelectric element by applying sufficient force to compress said piezoelectric element by substantially said predetermined axial amount, wherein said resilient means comprises spring means for applying a pre-loading compressive force of approximately 60 kilograms per square centimeter to said piezoelectric element;

attachment means for enabling attachment of said support means in an operating position;

whereby, said actuator unit may be attached in an operating position to externally apply said work piece displacement and said pre-loading enhances full displacement of said work piece; and an axial fine position adjusting mechanism located between said end member and said piezoelectric element comprising:

a first tapered wedge laterally contained within said support means;

a second tapered wedge, complementing said first wedge, extending laterally through said support means, having a lateral position adjusting and locking means with respect to said first wedge, whereby the lateral position of said second wedge can be adjusted externally to said support means so that the total axial thickness of the first and second wedge combined can be changed in small increments to accurately adjust said reference position of said work piece.

2. A piezoelectric actuator as described in claim 1 additionally comprising a coarse axial position adjusting mechanism comprising an adjusting screw and lock nut combination threaded through the center of said end member for axially adjusting the spacing between said end ember and said first wedge.

3. A self-contained pre-loaded piezoelectric actuator unit, for repetitively displacing a work piece from a reference position, comprising:

a piezoelectric element, including a plurality of laminations in an axial stack which is compressible by a predetermined axial amount by non-destructive compressive force, for displacing a work piece;

a work piece positioned at a first end of said piezoelectric element;

support means for supporting said said piezoelectric element and said work piece, including an end member for restraining a second end of said piezoelectric element, wherein a side portion of said support means is made of a combination of a first material having a higher thermal expansion coefficient than the piezoelectric element and a second material having lower thermal expansion than said piezoelectric element, said expansion characteristics and axial dimensions of first and second materials being chosen so that the overall thermal expansion characteristics match those of said piezoelectric element;

resilient means, resiliently coupling said work piece and said piezoelectric element to said end member, for pre-loading said piezoelectric element by applying sufficient force to compress said piezoelectric element by substantially said predetermined axial amount; and attachment means for enabling attachment of said support means in an operating position;

whereby, said actuator unit may be attached in an operating position to externally apply said work piece displacement and said pre-loading enhances full displacement of said work piece.

4. A self-contained pre-loaded piezoelectric actuator unit, for repetitively displacing a work piece from a reference position, comprising:

a piezoelectric element, including a plurality of laminations in an axial stack which is compressible by a predetermined axial amount by non-destructive compressive force, for displacing a work piece;

a work piece positioned at a first end of said piezoelectric element;

support means, for supporting said piezoelectric element and said work piece, including an end member for restraining a second end of said piezoelectric element, wherein a side portion of said support means is made of a ceramic material having stiffer longitudinal elasticity than a ferrous material;

resilient means, resiliently coupling said work piece and said piezoelectric element to said end member, for pre-loading said piezoelectric element by applying sufficient force to compress said piezoelectric element by substantially said predetermined axial amount; and attachment means for enabling attachment of said support means in an operating position;

whereby, said actuator unit may be attached in an operating position to externally apply said work piece displacement and said pre-loading enhances full displacement of said work piece.

5. A self-contained pre-loaded piezoelectric actuator unit, for repetitively displacing a work piece from a reference position, comprising:

a piezoelectric element, including a plurality of laminations in an axial stack which is compressible by a predetermined axial amount by non-destructive compressive force, for displacing a work piece;

a work piece positioned at a first end of said piezoelectric element, wherein said work piece is made of a material having a stiffer longitudinal elasticity than a ferrous material so that the displacement of said piezoelectric element is transmitted to the work being processed;

support means, for supporting said piezoelectric element and said work piece, including an end member for restraining a second end of said piezoelectric element;

resilient means, resiliently coupling said work piece and said piezoelectric element to said end member, for pre-loading said piezoelectric element by applying sufficient force to compress said piezoelectric element by substantially said predetermined axial amount; and attachment means for enabling attachment of said support means in an operating position;

whereby, said actuator unit may be attached in an operating position to externally apply said work piece displacement and said pre-loading enhances full displacement of said work piece.

6. A method for pre-loading a piezoelectric actuator unit to be attached to a press to enhance work piece displacement and cycling frequency range, comprising the steps of:

a. providing a form of piezoelectric actuator unit including a form of laminated piezoelectric element whose axial length may be shortened by application of compressive force, a work piece, a support device, and spring means for resiliently holding said work piece and piezoelectric element against an end member of said support device;

b. determining the amount of compressive force necessary to produce substantially the maximum shortening of said axial length of said piezoelectric element when subjected to non-destructive compressive force;

c. providing spring means able to exert a pre-loading force of substantially said amount of compressive force as determined in step (b), wherein said spring means exerts a pre-loading force not less than the greater of 30 kilograms per square centimeter or the force necessary to limit the duration of piezoelectric actuator unit deactivation vibration to less than one period of said cycling frequency; and d. assembling said form of piezoelectric actuator unit as described in step (a) incorporating said spring means as provided in step (c) to provide a pre-loaded piezoelectric actuator unit which is substantially free of work piece displacement loss due to piezoelectric element compression under load.

7. A method for pre-loading a piezoelectric actuator as described in claim 6, wherein said step (c) includes providing spring means exerting a pre-loading force in the range of 30 to 60 kilograms per square centimeter.

8. A method for pre-loading a piezoelectric actuator as described in claim 6, wherein said step (c) includes providing spring means exerting a pre-loading force of approximately 60 kilograms per square centimeter.

9. A self-contained piezoelectric actuator unit adapted to be attached to a press for repetitively displacing a work piece from a reference position for producing a force on a load in response to a voltage and returning the work piece to said reference position, comprising:

an elongate hollow cylindrical container being closed at a first end by an end member and closed at the opposite second end by a guide plate having a centrally located guide hole there through, a piezoelectric element comprising a stack of layers of piezoelectric material, which stack is axially compressible by a predetermined amount by a non-destructive compression force, said piezoelectric element being contained within said cylindrical container with a first end thereof engaging said end member, a cylindrical support member positioned within said container for axial longitudinal movement relative thereto and having a first surface engaging a second end of said stack of layers of piezoelectric material, an elongate work piece secured to a second surface of said support member opposite said first surface and extending through the guide hole in said guide plate, and spring means disposed between said guide plate and said second surface of said support member for applying a pre-loading compressive force to said piezoelectric element not less than the greater of 30 kilograms per square centimeter or the force necessary to limit the duration of piezoelectric actuator unit deactivation vibration of said piezoelectric element to less than one period of the frequency of said repetitive displacing of said work piece from said reference position to axially compress said element by said predetermined amount.

10. A pre-loaded piezoelectric actuator unit as described in claim 9, wherein said resilient means comprises spring means for applying a pre-loading compressive force in the range of 30 to 90 kilograms per square centimeter to said piezoelectric element.

11. A pre-loaded piezoelectric actuator unit as described in claim 11, wherein said resilient means comprises spring means for applying a pre-loading compressive force of approximately 60 kilograms per square centimeter to said piezoelectric element.

12. A pre-loaded piezoelectric actuator unit as described in claim 9, wherein said resilient means is a coil type spring pre-loaded to apply a compressive force in the range of 30 to 90 kilograms per square centimeter, via said work piece, to said piezoelectric element restrained against said end member.

13. A piezoelectric actuator as described in claim 9, wherein said actuator further includes an axial fine position adjusting mechanism located between said end member and said piezoelectric element comprising:
a first tapered wedge laterally contained within said support means;
a second tapered wedge, complementing said first wedge, extending laterally through said support means, having a lateral position adjusting and locking means with respect to first wedge, whereby the lateral position of said second wedge can be adjusted externally to said support means so that the total axial thickness of the first and second wedge combined can be changed in small increments to accurately adjust said reference position of said work piece.

14. A piezoelectric actuator as described in claim 13, wherein said actuator further includes a coarse axial position adjusting mechanism comprising an adjusting screw and lock nut combination threaded through the center of said end member for axially adjusting the spacing between said end member and said first wedge.

15. A piezoelectric actuator as described in claim 9, wherein a side portion of said support means is made of a combination of a first material having a higher thermal expansion coefficient than the piezoelectric element and a second material having lower thermal expansion than said piezoelectric element, said expansion characteristics and axial dimensions of said first and second materials being chosen so that the overall thermal expansion characteristics match those of said piezoelectric element.

16. A piezoelectric actuator as described in claim 9, wherein a side portion of said support means is made of a ceramic material having stiffer longitudinal elasticity than a ferrous material.

17. A piezoelectric actuator as described in claim 9 wherein said work piece is made of a material having a stiffer longitudinal elasticity than a ferrous material so that the displacement of said piezoelectric element is transmitted to the work being processed.

* * * * *

UNITED STATES PATENT AND TRADEMARK OFFICE
CERTIFICATE OF CORRECTION

PATENT NO. : 5,205,147
DATED : April 27, 1993
INVENTOR(S) : Wada et al.

It is certified that error appears in the above-identified patent and that said Letters Patent is hereby corrected as shown below:

Column 25, line 12, "claim 11" should read --claim 9--.

Signed and Sealed this

Eighteenth Day of January, 1994

Attest:

BRUCE LEHMAN

Attesting Officer   Commissioner of Patents and Trademarks